United States Patent
Edmond et al.

(10) Patent No.: US 7,482,183 B2
(45) Date of Patent: Jan. 27, 2009

(54) LIGHT EMITTING DIODE WITH DEGENERATE COUPLING STRUCTURE

(75) Inventors: John A. Edmond, Cary, NC (US); Kathleen M. Doverspike, Apex, NC (US); Michael J. Bergmann, Chapel Hill, NC (US); Hua-Shuang Kong, Cary, NC (US)

(73) Assignee: Cree, Inc., Durham, NC (US)

( * ) Notice: Subject to any disclaimer, the term of this patent is extended or adjusted under 35 U.S.C. 154(b) by 191 days.

(21) Appl. No.: 11/625,377

(22) Filed: Jan. 22, 2007

(65) Prior Publication Data

US 2007/0114541 A1    May 24, 2007

Related U.S. Application Data

(62) Division of application No. 10/367,495, filed on Feb. 14, 2003, now Pat. No. 7,170,097.

(51) Int. Cl.
*H01L 21/00* (2006.01)

(52) U.S. Cl. .............. 438/22; 438/29; 438/37; 438/39; 438/41; 438/46; 438/47

(58) Field of Classification Search .......... 438/22, 438/29, 36, 37, 39, 41, 42, 44, 46, 47
See application file for complete search history.

(56) References Cited

U.S. PATENT DOCUMENTS

| 4,865,685 A | 9/1989 | Palmour |
| 4,866,005 A | 9/1989 | Davis et al. |
| 4,912,063 A | 3/1990 | Davis et al. |
| 4,912,064 A | 3/1990 | Kong et al. |
| 4,918,497 A | 4/1990 | Edmond |
| 4,946,547 A | 8/1990 | Palmour et al. |
| 4,981,551 A | 1/1991 | Palmour |
| 5,011,549 A | 4/1991 | Kong et al. |
| 5,027,168 A | 6/1991 | Edmond |
| 5,087,576 A | 2/1992 | Edmond et al. |
| 5,119,540 A | 6/1992 | Kong et al. |
| 5,338,944 A | 8/1994 | Edmond et al. |
| 5,346,076 A | 9/1994 | Hart |

(Continued)

FOREIGN PATENT DOCUMENTS

| EP | 0 622 858 A2 | 11/1994 |
| GB | 1 206 502 A | 9/1970 |
| JP | 2003249683 A | 12/2003 |
| WO | WO 02/45223 A | 6/2002 |
| WO | WO 02/093658 A1 | 11/2002 |

OTHER PUBLICATIONS

Sze, Physics of Semiconductor Devices, 2d Edition (1981) John Wiley & Sons, Inc., pp. 304-307.

(Continued)

*Primary Examiner*—Kevin M Picardat
(74) *Attorney, Agent, or Firm*—Summa, Additon & Ashe, P.A.

(57) ABSTRACT

An electronic device includes a conductive n-type substrate, a Group III nitride active region, an n-type Group III-nitride layer in vertical relationship to the substrate and the active layer, at least one p-type layer, and means for providing a non-rectifying conductive path between the p-type layer and the n-type layer or the substrate. The non-rectifying conduction means may include a degenerate junction structure or a patterned metal layer.

34 Claims, 4 Drawing Sheets

U.S. PATENT DOCUMENTS

| | | | |
|---|---|---|---|
| RE34,861 E | | 2/1995 | Davis et al. |
| 5,393,993 A | | 2/1995 | Edmond et al. |
| 5,455,451 A | * | 10/1995 | Usagawa et al. ............ 257/661 |
| 5,523,589 A | | 6/1996 | Edmond et al. |
| 6,051,849 A | | 4/2000 | Davis et al. |
| 6,063,186 A | | 5/2000 | Irvine et al. |
| 6,117,688 A | | 9/2000 | Evans, Jr. et al. |
| 6,187,606 B1 | | 2/2001 | Edmond et al. |
| 6,201,262 B1 | | 3/2001 | Edmond et al. |
| 6,265,289 B1 | | 7/2001 | Zheleva et al. |
| 6,455,879 B1 | * | 9/2002 | Ashley et al. ............... 257/106 |
| 6,459,100 B1 | | 10/2002 | Doverspike et al. |
| 6,582,986 B2 | | 6/2003 | Kong et al. |
| 6,608,327 B1 | | 8/2003 | Davis et al. |
| 6,610,551 B1 | | 8/2003 | Doverspike et al. |
| 6,812,053 B1 | | 11/2004 | Kong et al. |
| 6,822,991 B2 | | 11/2004 | Collins et al. |

OTHER PUBLICATIONS

Sze, Physics of Semiconductor Devices, 2d Edition (1981) John Wiley & Sons, Inc., pp. 681-703.

Sze, Modern Semiconductor Device Physics (1998), John Wiley & Sons, Inc., pp. 84-89.

Streetman, Solid State Electronics, 2nd Edition (1980), Prentice-Hall, Inc., pp. 206-210.

Jeon et al.; Lateral current spreading in GaN-based light-emitting diodes utilizing tunnel contact junctions; Applied Physics Letters, vol. 78, No. 21; May 21, 2001; pp. 3265-3267; American Institute of Physics.

Sheu et al.; Low-Operation Voltage of InGaN/GaN Light-Emitting Diodes with Si-Doped In(0.3)Ga(0.7)N/GaN Short-Period Superlattice Tunneling Contact Layer; IEEE Electron Device Letters; vol. 22, No. 10; Oct. 2001.

Jeon S-R et al.; GaN-Based Light-Emitting Diodes using Tunnell Junctions, IEEE Journal of Selected Topics in Quantum Electronics, IEEE Service Center, US, vol. 8, No. 4, Jul. 2002, pp. 739-743.

* cited by examiner

LIGHT EMITTING DIODE WITH DEGENERATE COUPLING STRUCTURE

RELATED APPLICATIONS

This application is a divisional of application Ser. No. 10/367,495, scheduled to issue as U.S. Pat. No. 7,170,097. This application also incorporates entirely by reference commonly-assigned applications Ser. No. 09/706,057 (Group III Nitride Light Emitting Devices with Gallium-Free Layers), now U.S. Pat. No. 6,534,797 and Ser. No. 09/760,635 (Group III Nitride LED with Undoped Cladding Layer), now U.S. Pat. No. 6,800,876.

FIELD OF THE INVENTION

The present invention relates to semiconductor devices formed in wide bandgap semiconductor materials, and in particular relates to light-emitting devices with improved efficiency and brightness that combine a Group III nitride active layer with an n-type substrate and that emit visible light in the UV to green portion of the spectrum.

BACKGROUND OF THE INVENTION

A light-emitting diode (LED) is a widely used semiconductor device whose main characteristic is that it will emit energy in the form of light, usually within the visible spectrum, when a current flows through the device. The basic mechanisms by which light-emitting diodes operate are well understood in this art and are set forth, for example, by Sze, PHYSICS OF SEMICONDUCTOR DEVICES, 2d Edition (1981) at pages 681-703. Silicon carbide-based LEDs are described in U.S. Pat. Nos. 4,918,497 and 5,027,168, both of which are assigned to the assignee of the present invention and incorporated entirely herein by reference.

As is well known to those familiar with semiconductor devices, light-emitting diodes, and the interactions between light and matter, the wavelength of light (i.e., its color) that can be emitted by a given semiconductor material is limited by the physical characteristics of that material, specifically its bandgap. The bandgap in a semiconductor material represents the amount of energy that separates a lower energy valence band and a higher energy conduction band in which carriers (electrons or holes) can reside in accordance with well-known principles of quantum mechanics. When electrons and holes travel across the bandgap and recombine, they will, under certain circumstances, emit energy in the form of light. Biasing a semiconductor p-n junction to produce a current flow is one way to obtain such recombinations and the visible light they emit. Because the wavelength of light is inversely proportional to its frequency, and its frequency is directly proportional to the corresponding energy transition, certain wavelengths of light cannot be obtained in materials that have relatively narrow bandgaps. For example, blue light is generally considered to be that visible light which is emitted in the 400-500 nanometer (nm) portion of the visible spectrum. It will be understood that 400-500 nm is a somewhat arbitrary range, and that wavelengths close to 400 nm are also considered to be violet, and those close to 500 nm to be green. Such wavelengths require energy transitions of at least 2.6 electron volts (eV) which means that light-emitting diodes that will emit blue light must be formed of materials that have a bandgap of at least 2.6 eV. Such materials include, in certain circumstances, zinc selenide (ZeSe), Group III nitrides (e.g. GaN, AlGaN, InGaN), diamond, (C) and silicon carbide (SiC).

Silicon carbide has a number of attractive features from an electronic standpoint. It has a high saturated electron-drift velocity, a wide bandgap, a high thermal conductivity, a high breakdown electric field, and is "hard" to radiation. The desirable theoretical characteristics of silicon carbide, and its potential as a source material for blue LEDs, have been well understood for a number of decades, dating back almost to the beginning of the semiconductor era. Nevertheless, the difficulties of working with silicon carbide have precluded most researchers from producing commercially successful devices from it.

For example, silicon carbide can crystallize in over 150 polytypes, many of which are separated by very small thermodynamic differences. As a result, and as well known to those familiar with crystal growth techniques of semiconductors and other materials, obtaining the necessary pure single crystals of silicon carbide, and the typical epitaxial or implanted layers that are generally desired or required in many semiconductor device structures, has long been a difficult task.

In recent years, however, the assignees of the present invention have made significant progress in surmounting the process difficulties presented by silicon carbide and in taking advantage of its desirable characteristics. These include success in the areas of sublimation growth of single crystals (e.g., U.S. Pat. No. 4,866,005 and its reissue Re34,861); growth of epitaxial layers of silicon carbide on single crystals (U.S. Pat. Nos. 4,912,063 and 4,912,064); implantation and activation of dopants into silicon carbide (U.S. Pat. No. 5,087,576); and etching techniques for silicon carbide (U.S. Pat. Nos. 4,865,685 and 4,981,551).

Building upon these successes, the assignees of the present invention have produced the first commercially viable blue light-emitting diodes in significant commercial quantities at reasonable prices. Such LEDs are thoroughly described in U.S. Pat. Nos. 4,918,497 and 5,027,168.

Silicon carbide, however, is an "indirect" semiconductor, meaning that when a radiative recombination occurs in SiC, some of the energy is released as a phonon rather than a photon, thus reducing the overall efficiency of the process. A representative discussion of "Luminescent Efficiency" is set forth in Sze, supra at §12.22 beginning on page 686.

Accordingly, over the last decade, interest has increased in the wide bandgap direct emitters, particularly the Group III nitrides. For example, gallium nitride (GaN) has a direct bandgap energy of 3.36 eV at room temperature (300K). Furthermore, by including other Group III elements, particularly aluminum (Al) and indium (In) in ternary and quaternary compounds, Group III nitrides can be tailored to a great degree to meet desired criteria of wavelength, conductivity, lattice matching, refractive index, and chemical stability. Exemplary (but not limiting) patents include U.S. Pat. Nos. 5,393,993, 5,523,589, 6,201,262 and 6,187,606, each of which are assigned to the present assignee and are incorporated entirely herein by reference. Exemplary pending applications include Ser. Nos. 09/154,363 filed Sep. 16, 1998 and 09/477,982 filed Jan. 5, 2000, both for "Vertical Geometry InGaN LED." The contents of these applications are likewise incorporated entirely herein by reference.

For the time being, however, Group III nitride materials are not commonly available in bulk or substrate form. Instead, typical Group III nitride devices generally incorporate epitaxial layers of the nitrides on some other substrate material.

Sapphire ($Al_2O_3$) has been widely used as a substrate material for nitride devices. Sapphire offers optical transparency, chemical stability, and a manageable difference in lattice constant from most Group III nitrides. Sapphire cannot be conductively doped, however, and thus cannot form the basis of "vertical" devices, i.e. those in which ohmic contacts can be conveniently placed at opposite ends of the device.

Accordingly, the progress made in developing silicon carbide materials has also benefited the development of Group III nitride devices because SiC offers a better lattice match with most Group III nitrides than does sapphire and, perhaps most importantly, can be conductively doped. Thus, preferred Group III nitride device structures now incorporate vertical geometry using conductive SiC substrates. The patents referred to above incorporate these features.

Because an LED typically includes a diode structure (i.e., a p-n junction), commercial Group III nitride LEDs formed on a silicon carbide substrate generally include an n-type substrate and terminate in a p-type epitaxial layer, or alternatively, incorporate a p-type substrate and terminate in an n-type layer. The characteristics of silicon carbide, however, are such that the n-type of silicon carbide is somewhat easier to dope, and is more transparent when doped. Additionally, n-type semiconductors generally have a greater conductivity than do p-type semiconductors. Accordingly, the use of n-type layers wherever possible affords greater electrical conductivity (lower resistance) and optical transparency with resulting increases in light emission, efficiency, and current spreading for LED structures made therefrom.

Furthermore, producing successful ohmic contacts to p-type Group III nitride layers has often required a relatively high temperature anneal of the layer and the contact. For example, published European Patent Application 0 622 858 A2 to Nakamura et al. suggests that ohmic contacts to p-type layers require annealing at temperatures of at least 400° C., but recognizes that if the annealing temperature is too high, the Group III nitride compounds will begin to dissociate. Thus, the formation of ohmic contacts to p-type layers of Group III nitrides presents a compromise between the high temperatures desired for the anneal and the lower temperatures necessary to avoid dissociation or other degradation of the Group III materials.

Although it would be advantageous for a light emitting device to incorporate both an n-type substrate and an n-type Group III-nitride top layer, the presence of a p-n junction (hence a p-type layer) between two n-type layers would necessarily result in an n-p-n structure. As is known to those of skill in the art, a p-n junction rectifies current. That is, it permits net current to flow in only one direction (namely, from the p-type portion to the n-type portion). Thus, an n-p-n structure would prevent current flow in either the forward or reverse direction, thereby rendering the device inoperative.

Although these issues have been addressed to some extent in silicon carbide devices (e.g. U.S. Pat. No. 5,338,944; commonly assigned herewith and incorporated entirely herein by reference), they have not yet been addressed for the Group III-nitride devices. U.S. Pat. No. 5,338,944 discloses a light emitting diode formed on an n-type silicon carbide substrate with a degenerate junction structure for coupling the active layer to an n-type top layer while preventing n-p-n behavior between the n-type top layer, the active layer and the substrate. However, the device described in the '944 patent has a silicon carbide active region, which, as is discussed above, has a low efficiency of emission due to its indirect bandgap. In addition, Moreover, the device described in the '944 patent requires the formation of an ohmic contact to n-type silicon carbide after epitaxial deposition of the active layer, which typically requires additional dopant implantation and/or annealing steps.

SUMMARY OF THE INVENTION

Embodiments of this invention include a structure comprising an n-type substrate and an n-type Group III-nitride layer. A Group III nitride active region is positioned between the n-type substrate and the n-type layer. The structure includes at least one p-type layer located between the substrate and the top layer forming at least one p-n junction within the device. The structure further includes non-rectifying means for coupling either the n-type layer or the n-type substrate to the p-type layer to thereby permit electric current to flow in at least one direction in the device.

Preferred embodiments of the invention include a LED structure that will emit light within the ultraviolet to green portion of the spectrum and that will do so while maximizing the use of n-type material to take advantage of its higher conductivity, greater current spreading, and resulting increased brightness in an LED.

The foregoing and other advantages and objects of the invention will be understood more clearly when taken in conjunction with the detailed description and the accompanying drawings which illustrate preferred and exemplary embodiments and wherein:

DETAILED DESCRIPTION

Figure 1:
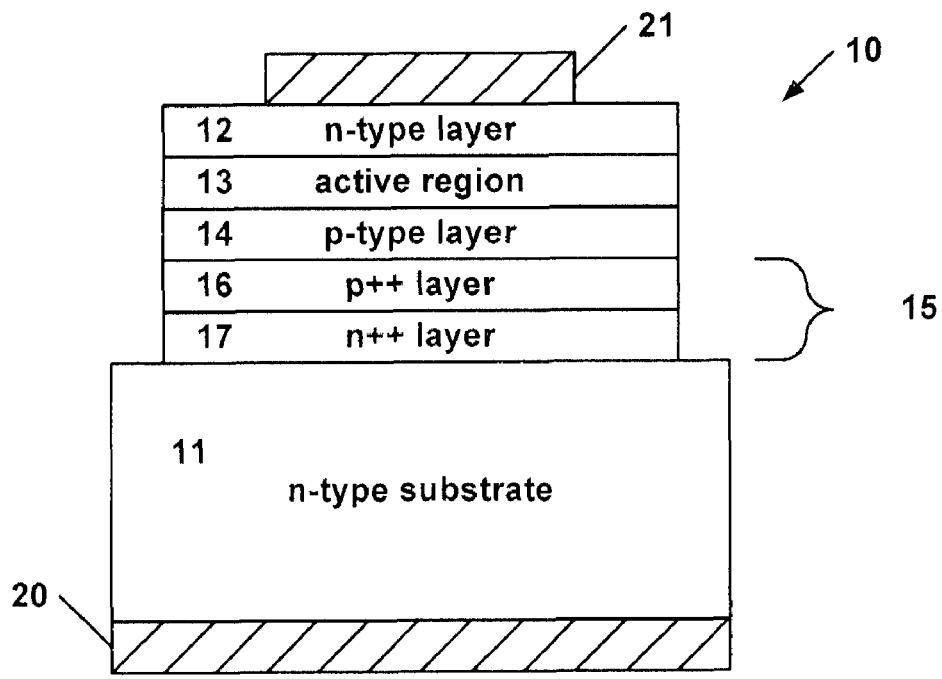
FIG. 1 is a cross-sectional view of a light emitting diode according to an embodiment of the present invention.

The present invention may be illustrated by reference to the embodiments set forth herein. According to a first embodiment of the invention, a light emitting diode broadly designated at 10 is illustrated in FIG. 1. As will be described herein, by various combinations and doping of Group III nitride materials in the active layer, such a diode can be tuned to emit in many portions of the physical spectrum, but for a number of purposes, the diode 10 is often most valuable in its capability to light in the ultraviolet (UV) to green portion of the electromagnetic spectrum.

As illustrated in FIG. 1, the diode 10 is formed on an n-type layer or substrate 11 which is preferably silicon carbide, but which may be bulk gallium nitride or any other suitable conductive n-type substrate. In preferred embodiments, the substrate is a single crystal silicon carbide substrate having a polytype selected from the group consisting of 3C, 4H, 6H and 15R. In a most preferred embodiment, the substrate is 6H SiC oriented along the (0001) plane. The growth and doping of such single crystal substrates is set forth in appropriate detail in U.S. Pat. No. 4,866,005 and its reissue as No. Re34,861, which are exclusively licensed to the assignee of the present invention. The contents of these patents are incorporated entirely herein by reference.

The diode also includes an n-type Group III-nitride contact layer in a vertical relationship with said substrate, with the contact layer being designated at 12 in FIG. 1.

The term "Group III-nitride" is used herein to refer to various binary, ternary, and quaternary Group III nitride compositions in which the total mole fraction of Group III elements (Al, Ga, In) is equal to the total mole fraction of nitrogen. Equivalent designations are often set forth as $Al_xIn_yGa_{1-x-y}N$ where $0 \leq x \leq 1$ and $0 \leq y \leq 1$ and $x+y \leq 1$, and it will be understood, unless specifically labeled to the contrary, that these designations are interchangeable. The use of these designations of both types is generally well understood to those of ordinary skill in this art. Furthermore, the use will also be clear in the context of the detailed description herein.

FIG. 1 further illustrates that the diode 10 includes an ohmic contact 20 to the substrate 11, and an ohmic contact 21 to the n-type top contact layer 12. In the device illustrated in FIG. 1, ohmic contact 20 serves as an anode while ohmic contact 21 serves as a cathode. Appropriate selections for ohmic contacts are set forth in many of the appropriate references in this field, and the selection of metals for ohmic contacts based on factors such as work function and bandgap are generally well understood in this art. Thus, appropriate ohmic contact metals can be selected without undue experimentation, but in preferred embodiments are selected from the group consisting of nickel, titanium, gold, platinum, alloys thereof and layered combinations thereof.

The diode 10 includes a Group III-nitride active region 13 formed between the n-type substrate 11, and the n-type contact layer 12. In FIG. 1, a preferred embodiment is shown in which the n-type contact layer 12 is immediately adjacent to the active region 13, but it will be understood that this is not always necessary for an appropriate functioning device.

Preferably, active region 13 comprises at least one layer of an n-type Group III-nitride material. Active region 13 may comprise a single heterostructure, double heterostructure, single quantum well or multi-quantum well of the type described in commonly assigned and copending U.S. patent application Ser. No. 09/154,363 filed Sep. 16, 1998 entitled "Vertical Geometry InGaN Light Emitting Diodes" and U.S. Provisional Patent Application Ser. No. 60/294,445, filed May 30, 2001 entitled "Multi-Quantum Well Light Emitting Diode Structure" each of which is incorporated herein by reference as if fully set forth.

The diode also includes at least one p-type layer 14 formed from the group consisting of Group III-nitrides or SiC between the contact layer 12 and the n-type substrate 11. Accordingly, in a preferred embodiment, device 10 comprises a p-n junction within or adjacent to active region 13 for supplying minority carriers to active region 13. Layer 14 could be a separate epitaxial layer distinct from active region 13 or could form a part of active region 13. As is well known to those skilled in the art, a conventional p-n junction rectifies current. That is, under normal bias conditions it permits net current flow in only one direction, namely, from the p-type layer to the n-type layer. In the embodiment illustrated in FIG. 1, current must flow in the direction from the anode 20 to the cathode 21 for the device to operate.

As FIG. 1 illustrates, both the top and bottom layers of the vertically oriented device 10 are n-type. Accordingly, the diode further comprises non-rectifying means illustrated by the bracketed portion 15 for coupling the n-type substrate 11 to p-type layer 14, while permitting current to flow in a non-rectified manner from substrate 11 to p-type layer 14. In the illustrated embodiment, the coupling means 15 comprises a degenerate junction structure formed of a degenerately doped p-type layer 16 and a degenerately doped n-type layer 17, with, in preferred embodiments, the p-type portion of the degenerate junction structure adjacent to p-type layer 14. In preferred embodiments, p-type layer 16 and n-type layer 17 comprise epitaxial silicon carbide.

In order to provide the appropriate coupling behavior, the doping in the p-type portion 16 and the n-type portion 17 in the degenerate junction structure 15 is sufficiently heavy to permit quantum mechanical tunneling of carriers through the narrow depletion region between the p-type layer 16 and the n-type layer 17. Thus, in preferred embodiments, the carrier concentration in the silicon carbide layers 16 and 17 is above about $1 \times 10^{19}$ cm$^{-3}$. The preferred dopant for p-type silicon carbide is aluminum, while the preferred dopants for n-type silicon carbide are nitrogen and phosphorus.

As used herein, the term "degenerate" has its ordinary meaning; i.e., a semiconductor material which has been extremely heavily doped with desirable impurities to give it a certain type of conductive character; i.e., a character which is more in the nature of a conductor than a semiconductor. The term "degenerate" is not used in a limiting fashion, however, and as will be seen from the discussion which follows, it is the functional characteristics which define the structure rather than any particular nomenclature. In some circumstances, a degenerate junction is alternatively referred to as a tunnel junction or a tunnel diode, but again, this definition is not limiting of the present invention. In the degenerate junction structure 15, the doping in the n-type portion 17 and the p-type portion 16 is sufficiently heavy to minimize or effectively eliminate the depletion region barrier that would otherwise exist between the p-type portion and the n-type portion in the degenerate junction structure 15. Another way of describing the electronic characteristic is to say that the doping is sufficiently heavy to substantially (essentially) eliminate the barrier between the p-type portion 16 and the n-type portion 17 of the silicon carbide from which the portions are formed. Similarly, designations such as "n+," "p+," "n++," or "p++" are not meant to be exact designations, but are intended to indicate a relative degree of doping between adjacent layers with illustrative values for the preferred embodiments being set forth herein.

In a preferred embodiment, and as illustrated in FIG. 1, the degenerate junction structure 15 is on the substrate 11 with the n-type silicon carbide layer 17 on the n-type silicon carbide substrate 11, and the p-type layer 14 is on the p-type silicon carbide layer 16. One or more intervening layers (not shown) may be placed between degenerate junction structure 15 and p-type layer 14 or between p-type layer 14 and active region 13 for strain relief, improvement of crystal quality, improvement of conductivity or other purposes without departing from the scope of the present invention.

In the most preferred embodiments, the degenerate junction structure 15 is formed of an epitaxial layer 16 of p-type silicon carbide and an epitaxial layer 17 of n-type silicon carbide. In order to function as well as possible, the epitaxial layers 16 and 17 in the degenerate junction structure 15 should be thin enough to substantially avoid absorption of light emitted from the light emitting active region 13. In actual practice, each of the layers 16 and 17 is preferably no more than about 1000 Å thick, and most preferably less than about 200 Å thick. Exemplary techniques for growing SiC epitaxial layers (or "epilayers") are set forth in a number of commonly-assigned or commonly-licensed U.S. patents including Nos. 4,912,064; 5,011,549; 5,119,540; 4,946,547; and 6,063,186; the contents of which are incorporated entirely herein by reference.

Figure 3A:
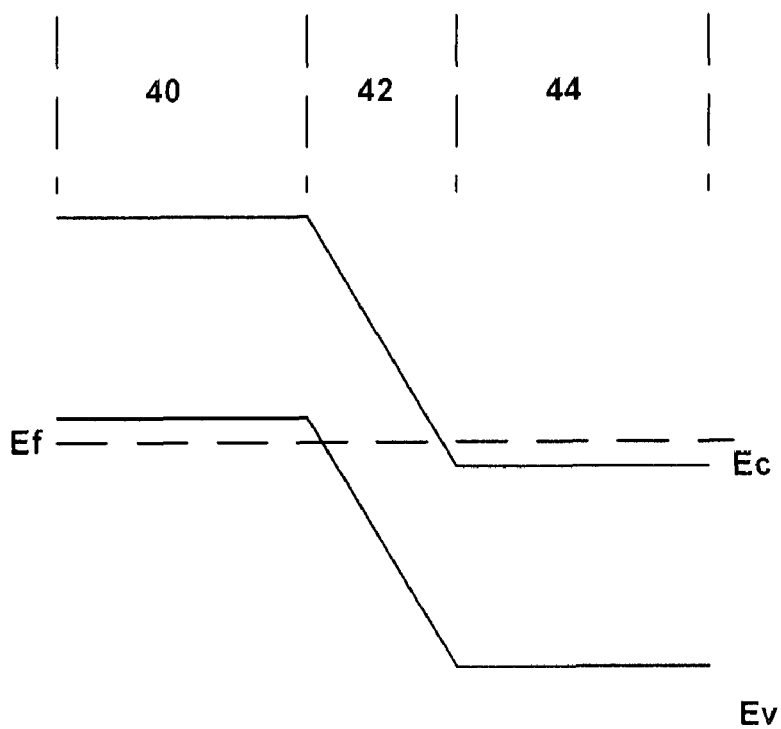
FIG. 3A is a band diagram of a p-n tunnel junction under zero bias conditions.
Figure 3B:
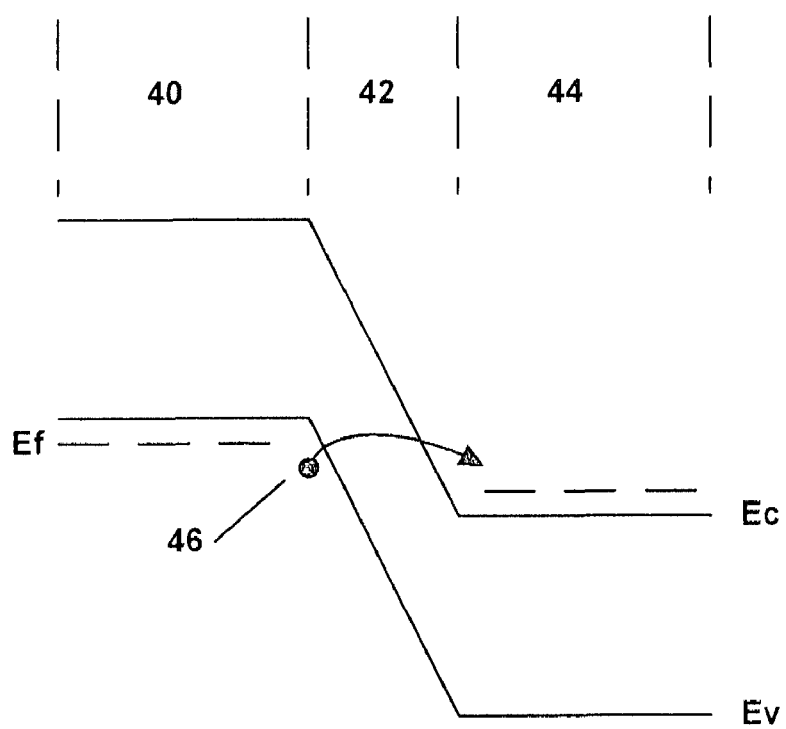
FIG. 3B is a band diagram of a p-n tunnel junction under reverse bias conditions.

In another aspect, the degenerate junction structure can be described as a tunnel diode structure. The operation and behavior of tunnel diode structures is described, for example, in B. Streetman, SOLID STATE ELECTRONICS, 2nd Ed. (1980) pp. 206-210. As is known to those familiar with semiconductor devices, a tunnel diode is a single p-n junction in which both the p and the n regions are heavily doped with impurities. This produces a very narrow depletion region. Under reverse bias, the electrons can tunnel or pass directly through the junction, thus permitting non-rectified current flow from the n-type region to the p-type region. Tunnel junction operation is illustrated in the band diagrams of FIGS. 3A and 3B. As shown in FIG. 3A, a tunnel junction comprises a metallurgical junction between degenerately doped p-type layer 40 and degenerately doped n-type layer 44, forming a thin depletion region 42 therebetween. Due to the high doping levels in layers 40 and 44, the Fermi level $E_f$ lies below the valence band energy $E_v$ in p-type layer 40 and above the conduction band energy $E_c$ in n-type layer 44. Therefore, when a reverse bias is applied to the device (FIG. 3B), electrons 46 in the valence band of layer 40 can easily "tunnel" through the thin depletion region into empty states in the conduction band of layer 44, thereby creating a flow of electronic current in the device.

Accordingly, when viewed as including a tunnel junction, the light emitting diode 10 comprises the n-type substrate 11, the Group III nitride active region 13, the n-type Group III-nitride contact layer 12 in vertical relationship to the substrate 11 and to the active region 13, the at least one p-type layer 14 for supplying hole carriers into the active layer when a forward bias is applied to the device 10, and the tunnel diode structure 15 between the n-type substrate 11 and the p-type layer 14 providing a non-rectifying means for permitting current to flow from substrate 11 to p-type layer 14.

As is recognized by those of ordinary skill in this art, the active region 13 can be doped or undoped.

Figure 2:
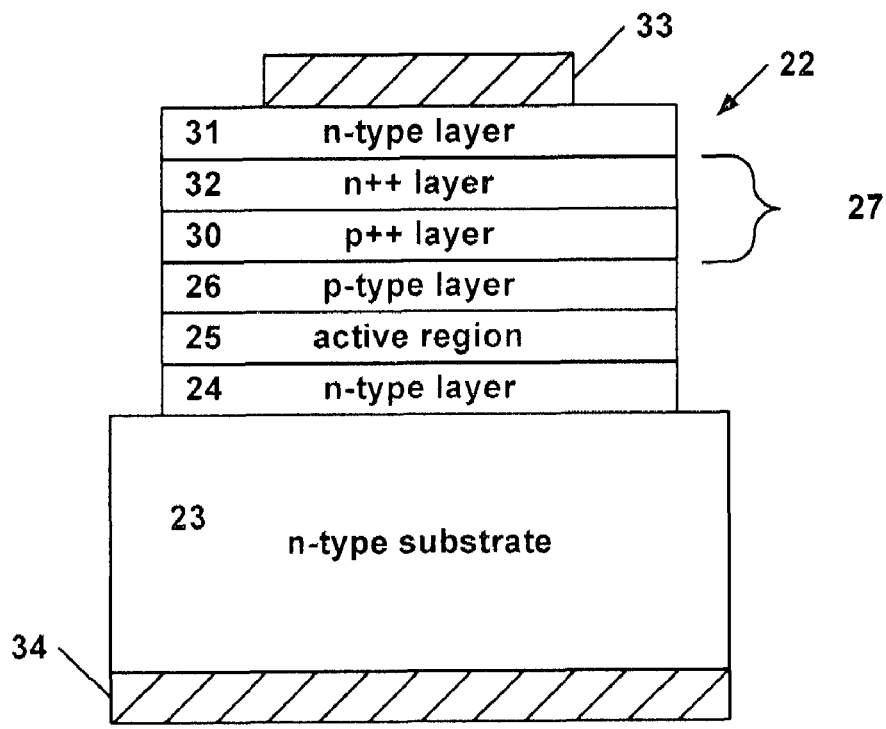
FIG. 2 is a cross-sectional view of another embodiment of the present invention.

In another embodiment of the invention, a device 22 that includes a degenerate junction structure is illustrated in FIG. 2. In this embodiment, the device also includes an n-type substrate 23, but with an n-type Group III-nitride layer 24 formed on the substrate 23. An active region 25 is formed above the n-type layer 24 and a p-type Group III-nitride layer is formed above or within the active region 25. In this embodiment, the degenerate junction structure is illustrated by the brackets 27 and is formed on the p-type layer 26, with the p-type layer 30 of the degenerate juncture structure 27 on the p-type layer 26, and with an optional n-type layer 31 formed on the n-type layer 32 of the degenerate juncture structure 27. Ohmic contacts 33 to the contact layer 31 and 34 to the substrate 23, forming a respective anode and cathode complete the structure. It will be understood that ohmic contact 33 could be formed directly on n-type layer 32.

In one embodiment, p-type layer 30 and n-type layer 32 are Group III-nitride epitaxial layers. This particular embodiment tends to be less favored at present because of the difficulty in achieving degenerately doped nitride epitaxial layers. In another embodiment, p-type layer 30 and n-type layer 32 may be formed of a II-VI material such as zinc selenide which can be degenerately doped and does not require a growth temperature that would cause the underlying Group III-nitride layers to decompose. Since II-VI materials such as zinc selenide have a relatively wide bandgap, little optical energy would be lost due to absorption in the tunnel junction region 27.

Figure 4:
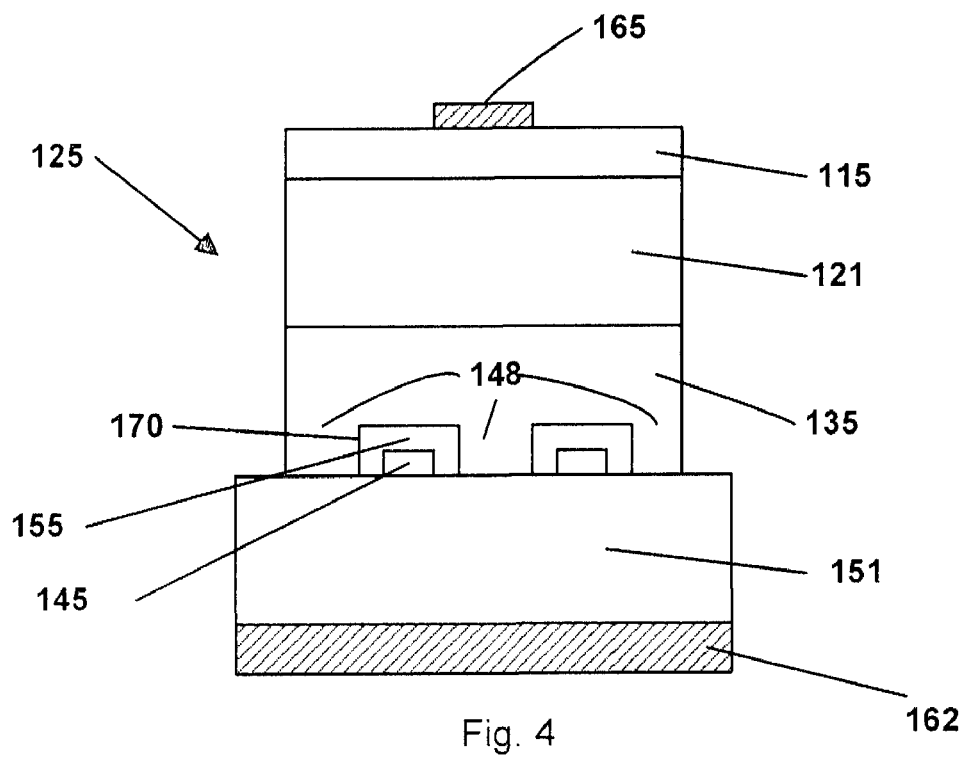
FIG. 4 is a cross-sectional view of another embodiment of the present invention.

Another embodiment invention is illustrated in part by the device broadly designated at 125 in FIG. 4. In its broadest aspects, this embodiment of the invention comprises a semiconductor structure formed of a substrate (or first layer) 151 of a first semiconductor material having a first conductivity type, which in preferred embodiments is formed of n-type 6H SiC (0001). A first patterned metal layer 145 is formed on first semiconductor layer 151 and is formed of a metal, preferably nickel when the n-type substrate 151 is silicon carbide, that forms an ohmic contact to the first semiconductor material. Layer 145 may be patterned with a plurality of windows or openings 148. Preferably, the openings 148 in patterned metal layer 145 are in the form of stripes or rectangular openings extending along the <1$\bar{1}$00>direction of the first layer 151. When the first layer 151 is formed of a material other than silicon carbide, the ohmic metal is selected as one that makes an ohmic contact to that material. The nature of selecting an ohmic contact to a particular semiconductor material is generally well understood in this art, and thus, although specific ohmic metals will be described herein, it will be understood that the invention is not limited to the particular examples. See, e.g. Sze, Physics of Semiconductor Devices (1981), John Wiley & Sons, Inc. at Section 5.7, "Ohmic Contact" at pages 304-307, and Sze, Modern Semiconductor Device Physics (1998), John Wiley & Sons, Inc. at Section 2.2, "Schottky Barriers and Ohmic Contacts" at pages 84-89.

The embodiment illustrated in FIG. 4 next comprises a second patterned metal layer 155 on the first patterned metal layer 145. The second patterned metal layer 155 is patterned to overlie first patterned metal layer 145, as illustrated in FIG. 4.

The invention next comprises a layer 135 of a second semiconductor layer having a second conductivity type, illustrated by the p-GaN layer 135 in FIG. 4. The second layer 135 is formed on first layer 151 and the second patterned metal layer 155. The second semiconductor material 135 has the opposite conductivity type from the first semiconductor material 151. In preferred embodiments, the second semiconductor material is preferably a p-type Group III nitride having the formula $Al_xIn_yGa_{1-x-y}N$ where $0 \leq x \leq 1$ and $0 \leq y \leq 1$ and $x+y \leq 1$, with gallium nitride (GaN) being most preferred.

The second patterned metal layer 155 forms an ohmic contact to the second semiconductor material 135 and a direct metallic contact to the first patterned metal layer 145 for permitting current to flow in a non-rectified path between the first 151 and second 135 opposite conductivity type layers. In preferred embodiments, when the layer 135 is p-type gallium nitride, the ohmic metal is preferably platinum.

It will be understood that each of the metal layers 145 and 155 can themselves comprise two or more metals in layered or alloyed form provided that they functionally perform as ohmic contacts in the manner described, and do not otherwise adversely affect the structure or function of the overall structure or device. Further to the preferred embodiments, the p-type gallium nitride layer 135 is preferably an epitaxial lateral overgrowth ("ELO") layer. As used herein, the term epitaxial lateral overgrowth refers to a type of growth technique and resulting structure that is described in (for example) U.S. Pat. No. 6,051,849 to Davis et al., which issued on Apr. 18, 2000, U.S. Pat. No. 6,265,289 issued Jul. 24, 2001, U.S. Pat. No. 6,177,688 issued Jan. 23, 2001 and in co-pending application Ser. No. 08/031,843 filed Feb. 27, 1998 for "Methods of Fabricating Gallium Nitride Semiconductor Layers by Lateral Overgrowth Through Offset Masks, and Gallium Nitride Semiconductor Structures Fabricated Thereby." A so-called "single step" technique for performing epitaxial lateral overgrowth is described in co-pending application Ser. No. 09/679,799 filed Oct. 5, 2000 for "Single-Step Pendeo and Lateral Epitaxial Overgrowth of Group III-Nitride Epitaxial Layers with Group III-Nitride Buffer Layer and Resulting Structures." The contents of the '849, '289 and '688 patents and the '843, and '799 applications are each incorporated entirely herein by reference.

Although the technique of epitaxial lateral overgrowth is not a necessary aspect of the invention, it does offer certain advantages, some of which will be described with respect to the method aspects of the invention. In the example of the use of the ELO growth process in connection with the present invention, layer 135 is grown from the exposed surface of layer 151 vertically through the openings 148 in metal layers 145, 155 and then horizontally across metal layers 145, 155. In that respect, metal layers 145, 155 provide a non-rectifying conductive path between layers 151 and 135, and also serve as the patterned mask layers used to obtain ELO growth as described in the above-mentioned patent and applications.

In another aspect, the invention comprises the entire device illustrated at 125 in FIG. 4. In this aspect, the invention comprises the n-type silicon carbide substrate 151 and a first patterned metal layer 145 on the substrate 151 that forms an ohmic contact to the n-type silicon carbide substrate 151.

In preferred embodiments, the silicon carbide substrate is a single crystal having a polytype selected from the group consisting of 3C, 4H, 6H, and 15R. Most preferably, the substrate is 6H-SiC (0001). As noted previously, when the conductive substrate 151 is n-type silicon carbide, the first metal layer 145 that forms the ohmic contact to layer 151 is preferably formed of nickel (Ni).

The step of depositing a particular metal on the surface of a semiconductor substrate or epitaxial layer is likewise well understood by those of ordinary skill in this art. In general, a metallizing technique is selected based upon both the semiconductor material, and the metal to be deposited. Useful and preferred techniques include chemical reduction, electroplating, vacuum evaporation, cathode sputtering, and vapor deposition.

The device next includes the second patterned metal layer 155 overlying the first patterned metal layer 145 and patterned in a similar manner to produce openings or windows 148 therein.

The device 125 next includes the layer 135 of p-type Group III nitride material, preferably gallium nitride formed on the silicon carbide substrate 151 and on the second patterned metal layer 155. The second metal layer 155 forms an ohmic contact to the Group III nitride material 135 and a direct contact to the first metal portions 145 for permitting current to flow in a non-rectified path between the n-type silicon carbide substrate 151 and the p-type Group III nitride layer 135. As noted earlier, when the p-type Group III nitride layer 135 is gallium nitride, the second metal 155 is preferably platinum (Pt).

As also mentioned previously, in preferred embodiments the p-type gallium nitride layer 35 is grown via epitaxial lateral overgrowth techniques.

The device next includes the active region 121 on the p-type Group III nitride layer 135 with the active region 121 comprising a plurality of layers formed from the group consisting of binary, ternary and quaternary Group III nitrides. The active region 121 can comprise a single quantum well and multiple quantum wells, a p-n homojunction, single heterojunction or double heterojunction, with a single or multiple quantum well structure being the most preferred. The nature of quantum wells and their advantages are generally well understood in this art as are the nature and advantages of heterojunctions with respect to homojunctions and vice versa. Accordingly, these will not be described in detail herein other than as necessary to describe the invention.

In preferred embodiments, at least one of the quantum wells will comprise indium gallium nitride, with other preferred embodiments including a single active layer comprising aluminum indium gallium nitride having the formula $Al_xIn_yGa_{1-x-y}N$ where $0 \leq x \leq 1$ and $0 \leq y \leq 1$ and $x+y \leq 1$.

Because the invention and its structure permits the active region 121 to be formed on a p-type layer 135, the device can next include the top contact layer 115 which is n-type, and preferably n-type gallium nitride. As noted in the background portions of the specification, the greater conductivity of n-type materials is advantageous in current flow and injection and permits the use of a smaller ohmic contact 165 on the top contact layer 115 thus contributing to the greater output and efficiency of the device 125. In this regard, the respective ohmic contacts 165 to the top contact layer 115 and 162 to the conductive substrate 151 form the device in a vertical orientation. As noted earlier, appropriate ohmic metals can be selected without undue experimentation by those of ordinary skill in this art.

Because of the structural advantages of the vertical orientation of the device 125, it can easily be incorporated into lamps and pixels. An LED lamp is generally understood (although this is an exemplary description rather than a limiting one) to consist of a light emitting diode that is encapsulated in a material (typically plastic) with a desired refractive index and has relatively large external wire contacts (leads) attached to it to form a device that is generally relatively much larger than the LED itself and which can be incorporated into appropriate applications in accordance with its larger size.

A pixel ("picture element") is generally understood to be the smallest individual element of a display, and can be analogous to a point source of light output. In a full color display a pixel preferably includes all three primary colors (red, green and blue) in order to enable the display to produce as many color combinations as possible.

Figure 5:
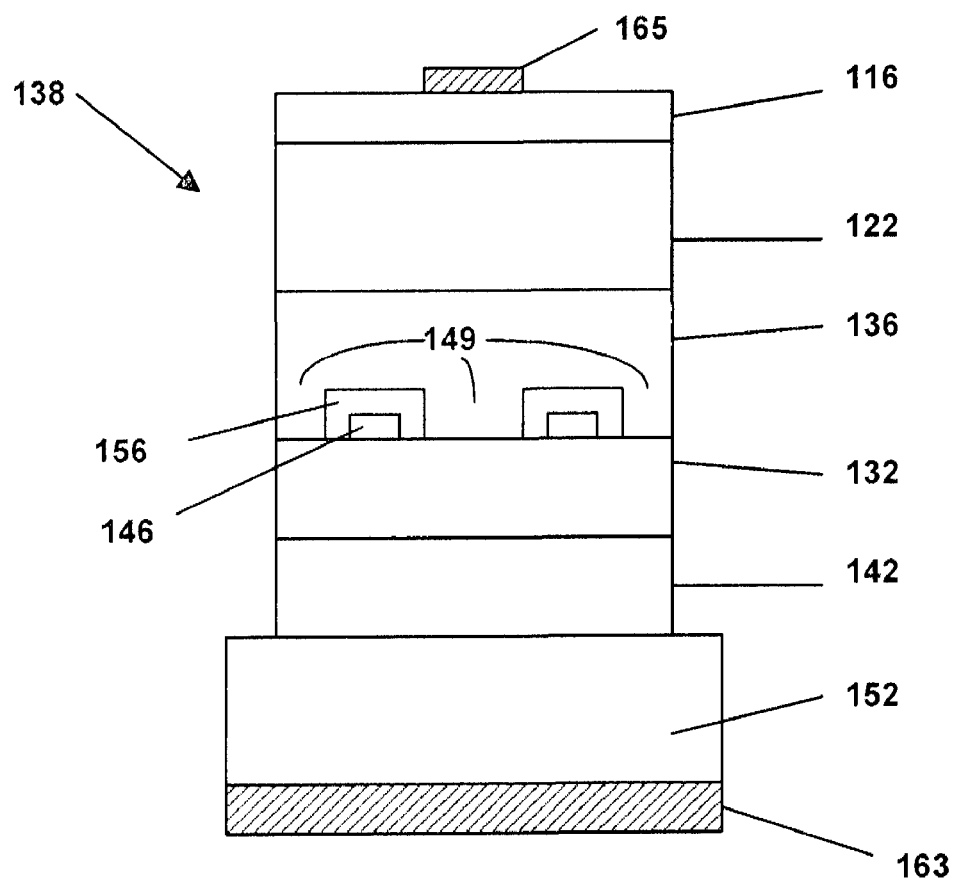
FIG. 5 is a cross-sectional view of another embodiment of the present invention.

FIG. 5 illustrates another embodiment of the invention in a device broadly designated at 138. In this embodiment, the light emitting diode 138 includes an n-type conductive buffer layer 142 formed of a Group III nitride layer on the silicon carbide substrate 152, with aluminum gallium nitride being the preferred material for the conductive buffer layer 142. Exemplary buffer layers are also described in U.S. Pat. Nos. 5,393,993 and 5,523,589.

The light emitting diode 138 next includes an optional n-type layer 132 on the buffer layer 142. N-type layer 132 is preferably formed of n-type gallium nitride. A first patterned metal layer 146 having a plurality of windows or openings 149 therethrough is formed on the underlying n-type layer 132 (or, if layer 132 is omitted, on buffer layer 142). Preferably, the openings 149 in patterned metal layer 146 are in the form of stripes or rectangular openings extending along the <1$\bar{1}$00> direction of the underlying layer 132. The first metal layer 146 is formed of a metal that forms an ohmic contact to the n-type gallium nitride layer 132.

A second patterned metal layer 156 is formed on the first patterned metal layer 146 and patterned in a similar manner to produce openings or windows 149 therein.

The light emitting diode 138 next includes a p-type layer 136 formed on the n-type layer 132 and on the second patterned metal layer 156. In order to facilitate lattice matching and reduce strain, p-type layer 136 is preferably formed of the same material as layer 132, albeit with opposite conductivity. Preferably, p-type layer 136 is formed of gallium nitride.

The second metal layer 156 forms an ohmic contact to the p-type layer 136 and a direct metallic contract to the first metal layer 146 for permitting current to flow in a non-rectified path between the n-type layer 132 and the p-type layer 136.

In the more preferred embodiments, the p-type gallium nitride layer 136 is an epitaxial lateral overgrowth layer, and the second metal 156 is platinum.

The device 138 next includes an active region 122 on the p-type gallium nitride layer 136 and formed in accordance with the description of region 121 in FIG. 4 above. The light emitting diode 138 next includes an n-type gallium nitride contact layer 116 on the active region 122. The advantages of the n-type top contact layer have been previously described herein.

The vertical orientation and the advantages of the device are completed by including the ohmic contact 165 to the n-type gallium nitride contact layer 116 and the ohmic contact 163 to the n-type silicon carbide substrate 152.

As in the embodiment illustrated in FIG. 4, the light emitting diode 138 set forth in FIG. 5 can be incorporated into a lamp or into a pixel as may be desired for particular end uses.

Figure 6:
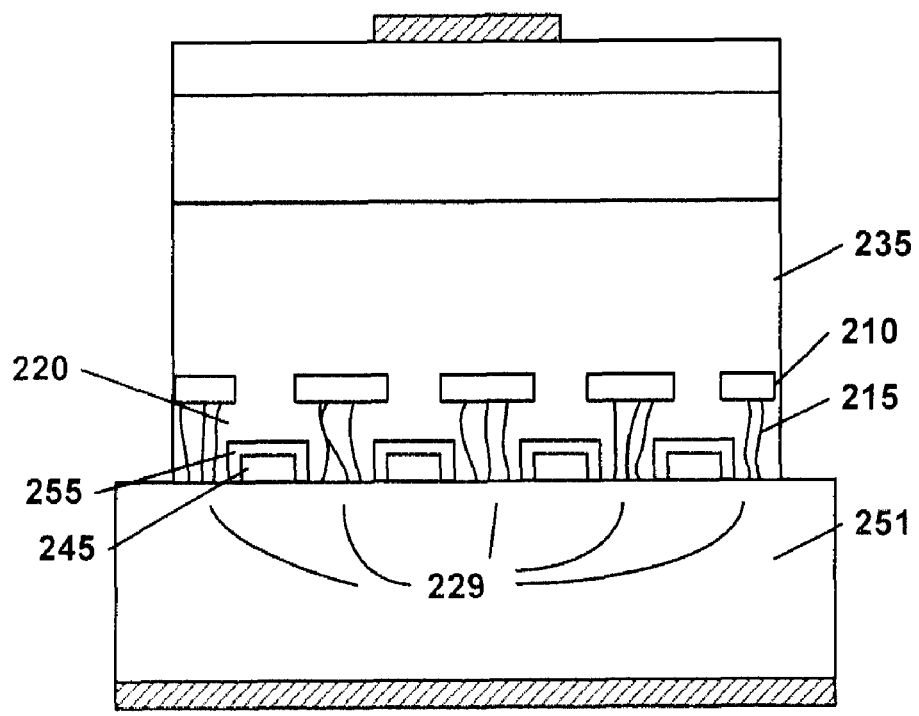
FIG. 6 is a cross-sectional view of another embodiment of the present invention.

Yet another embodiment of the present invention is illustrated in FIG. 6. In this embodiment, the technique described in U.S. application Ser. No. 09/031,843 entitled "Methods of Fabricating Gallium Nitride Semiconductor Layers by Lateral Overgrowth Through Offset Masks, and Gallium Nitride Semiconductor Structures Fabricated Thereby" is utilized.

In the device illustrated in FIG. 6, a first semiconductor layer 251 is provided having a first conductivity type. A first patterned metal layer 245 is formed thereon, and a second patterned metal layer 255 is formed on the first metal layer in the manner described above in reference to FIGS. 4 and 5. Next, a first ELO layer 220 having a second conductivity type opposite the first conductivity type is formed using ELO techniques described above. As in the embodiments illustrated in FIGS. 4 and 5, the first patterned metal layer 245 forms an ohmic contact with first semiconductor layer 251, while the second metal layer 255 forms an ohmic contact with layer 220.

As illustrated in FIG. 6, the regions of first ELO layer 220 lying above openings 229 in the patterned metal layers 245, 255 contain a high number of dislocation defects illustrated as 215, which propagate upward as the material is grown. The regions of layer 220 above the metallized portions of metal layers 245, 255 exhibit significantly reduced defect density since lateral layer 220 is grown laterally across those areas. After formation of first ELO layer 220, a patterned mask 210 is formed on the surface thereof. Mask 210 is offset from the metal layers 245, 255 such that the mask 210 extends above the openings 229 in the patterned metal layers 245, 255 and includes openings above the metallized regions of metal layers 245, 255. Mask 210 serves to block the dislocation defects 215 from propagating upwards. Mask 210 may comprise an insulating material such as $SiO_2$ or $Si_xN_y$, and need not be conductive.

Next, a second ELO layer 235 having the same conductivity type as first ELO layer 220 is formed. In that manner, second ELO layer 235 has a reduced dislocation defect density throughout the entire layer. The remainder of the device structure is similar to that described in connection with FIGS. 4 and 5 and need not be described further.

Figure 7:
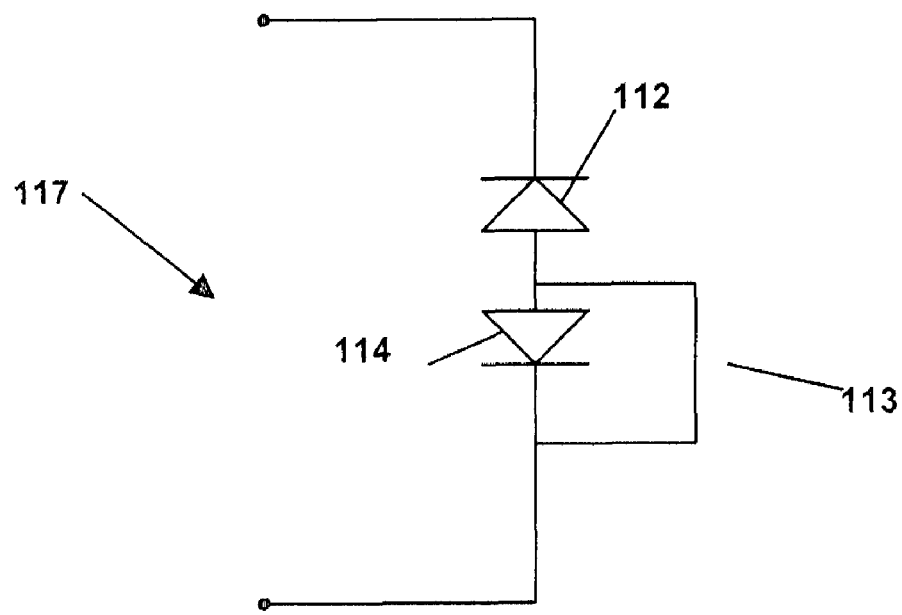
FIG. 7 is an equivalent circuit diagram illustrating the operation of embodiments of the present invention.

In another aspect, the invention can be understood as the equivalent circuit broadly designated at 117 in FIG. 7. As thus understood, the invention comprises opposing diodes 112 and 114 in series with one another and a short circuit 113 around one of the opposing diodes (114 in FIG. 7) for permitting current flow in a nonrectifed path through the circuit 117.

The opposing diodes 112 and 114 are formed of a layer of a p-type semiconductor material between two n-type layers of semiconductor material and the short circuit 113 is formed of a layer of a first metal covered with a layer of a second, different metal and is positioned between the p-type layer and one of the n-type layers. The first metal forms an ohmic contact to the p-type layer and the second metal forms an ohmic contact to the n-type layer. In this regard, the layers and the metals have the same relationship, composition, and function as has been described with respect to FIGS. 1, 2 and 4-6.

As set forth with respect to the earlier description of FIGS. 1, 2 and 4-6, in preferred embodiments the equivalent circuit is formed of opposing diodes which in turn comprise a p-type gallium nitride layer between n-type silicon carbide and an n-type Group III nitride. When the materials are so selected, the ohmic contacts compromise nickel to the silicon carbide portion and platinum to the p-type gallium nitride layer.

In the other aspects of the embodiment, the opposing diodes 112 and 114 can comprise a p-type gallium nitride layer between n-type gallium nitride and an n-type Group III nitride.

When understood as the equivalent circuit, the invention can further comprise a light emitting diode formed of an equivalent circuit 117 between an n-type semiconductor substrate and an n-type semiconductor contact layer. The layers and the equivalent circuit are preferably arranged in a vertical orientation.

In another aspect, the invention comprises a method of forming a light emitting diode that incorporates a Group III nitride layer while avoiding undesired formation of ohmic contacts or p-type layers. In this aspect, the method comprises forming a Group III nitride active layer in combination with a conductive n-type substrate. The method also comprises forming a p-type layer for providing a p-n junction associated with the active layer, and by which minority carriers may be supplied to the active layer. The method also comprises forming an n-type Group III nitride layer and adding respective ohmic contacts to the substrate and the n-type layer in a vertical orientation. In particular, the method comprises forming a structure between the n-type layer or the n-type substrate and the p-type layer that permits current to flow in a non-rectified manner from the n-type layer or the n-type substrate to the p-type layer.

In one embodiment, the step of forming a structure between the top contact layer or the n-type substrate and the p-type layer that permits current to flow in a non-rectified manner comprises forming a p-n junction structure from a degeneratively doped p-type epitaxial layer and a degeneratively doped n-type epitaxial layer. In one embodiment, the degenerate n-type epitaxial layer is formed on the n-type substrate. In this embodiment, the method further comprises forming a p-type Group III-nitride layer on the degeneratively doped p-type epitaxial layer, then forming the active region on the p-type layer, and forming the n-type layer on the active region. In another embodiment, the degenerate p-type layer is formed above the active region, and the degenerate n-type layer is formed on the degenerate p-type layer.

In another aspect, the step of forming a structure between the n-type layer or the n-type substrate and the p-type layer that permits current to flow in a non-rectified manner comprises invention comprises masking a layer of a first semiconductor material with a qualifying metal layer or layers, and then growing a layer of the opposite conductivity type semiconductor material between and then over the masking metal layer.

The technique for growing the layer of opposite conductivity type can be any one of several set forth in previously incorporated U.S. Pat. No. 6,051,849 or the previously incorporated ELO references, or any of the other ELO techniques cross-referenced therein. As known to those familiar with ELO, the technique set forth in the '849 patent is generally referred to as a "two-step" technique in that it requires the presence of gallium nitride layer which is then patterned and on top of which pattern a second layer of gallium nitride is grown to include both vertical and lateral portions. U.S. patent application Ser. No. 09/679,799 describes a single step growth technique. Because metal portions are already used in the invention for providing the non-rectified path between the n-type and p-type layers, the metal portions can be used in place of some other type of mask or trench to form the structures that are necessary and helpful for epitaxial layer overgrowth.

In general, the one-step ELO technique is preferred for making the embodiment illustrated in FIG. 4 (p-GaN on n-SiC), while the two-step technique is preferred for making the embodiment illustrated in FIG. 5 (p-GaN on n-GaN).

As further set forth in the '799 application, the size and spacing (also referred to as the "period") of the metal portions can help control the relationship of the vertical and lateral growth rates of the gallium nitride layer to produce the desired results. This technique is set forth in detail in the '799 application and will not be otherwise described herein other than to note its particular advantages.

In preferred embodiments, the metal layers are patterned as stripes oriented along the <1$\bar{1}$00> direction of the underlying layer. If the ELO technique is used to form the p-type epilayer, the width and spacing of the stripes can be selected to enhance the ELO process. In other embodiments, metal layers are patterned with rectangular openings.

It will also be understood that the method of forming a device according to the present invention does not require ELO, but that this is a preferred technique for providing the highest quality epitaxial layers of gallium nitride and other Group III nitrides.

In preferred embodiments, the steps of forming the active region, the n-type layer, and the p-n junction structure layers comprise chemical vapor deposition growth of the layers. Chemical vapor deposition growth of Group III nitrides and silicon carbide are generally well understood in the art with exemplary patents having been incorporated earlier herein. The nature of crystal growth is, however, sometimes specific to the particular circumstances and equipment used. Thus it will be understood that those of ordinary skill in this art generally have the expertise to reproduce the described results in individual circumstances with minor changes, but without undue experimentation.

As a particular advantage, because the method forms a device in which both the top and bottom layers (for example the top contact layer 12 and the silicon carbide substrate 11 of FIG. 1) are n-type, the device and its method of manufacture eliminate the need to anneal a p-type ohmic contact. As set forth earlier herein, ohmic contacts can be appropriately selected by those of ordinary skill in this art, but exemplary ohmic contacts to silicon carbide and Group III nitrides are preferably selected, depending upon conductivity type and other circumstances from the group consisting of platinum, aluminum, titanium, nickel, and alloys thereof and layered combinations thereof to the substrate, and a contact selected from the group consisting of aluminum, titanium, nickel, and gold and alloys thereof and layered combinations thereof to the top contact layer.

Moreover, because the top layer comprises an n-type Group III nitride layer, the device may exhibit improved current spreading as compared to a conventional nitride-based device. Consequently, a device according to the present invention may exhibit better thermal characteristics and better overall efficiency.

In the drawings and the specification, typical embodiments of the invention have been disclosed. Specific terms have been used only in a generic and descriptive sense, and not for purposes of limitation. The scope of the invention is set forth in the following claims.

The invention claimed is:

1. A method of forming a light emitting device (LED) that incorporates a Group III nitride layer, the method comprising:
   forming an n-type Group III nitride active region on an n-type semiconductor layer;
   forming a p-type semiconductor layer on the active region;
   forming a degenerate junction structure on the p-type semiconductor layer;
   forming an n-type contact layer on the degenerate junction structure, wherein the degenerate junction structure includes at least one p-n junction for coupling the p-type semiconductor layer to the n-type contact layer to thereby permit electric current flow from the n-type contact layer to the active region.

2. A method of forming an LED according to claim 1 wherein the step of forming the degenerate junction structure comprises forming a p-n junction structure from a degeneratively-doped p-type silicon carbide epilayer on the p-type semiconductor layer and a degeneratively-doped n-type silicon carbide epilayer on the p-type silicon carbide epilayer.

3. A method of forming an LED according to claim 1 wherein the carrier concentration in the degeneratively doped p-n junction structure is above about $1 \times 10^{19}$ cm$^{-3}$.

4. A method of forming an LED according to claim 2, wherein the step of forming the p-type epilayer comprises forming a layer of silicon carbide doped with aluminum.

5. A method o forming an LED according to claim 2, wherein the step of forming the n-type epilayer comprises forming a layer of silicon carbide doped with a dopant selected from the group consisting of nitrogen and phosphorous.

6. A method of forming an LED according to claim 1 wherein the step of forming the degenerate junction structure comprises forming a p-n junction structure from a degeneratively-doped p-type Group III nitride epilayer on the p-type semiconductor layer and a degeneratively-doped n-type Group III nitride epilayer on the p-type silicon carbide epilayer.

7. A method of forming an LED according to claim 1 wherein the carrier concentration in each layer of the degeneratively doped p-n junction structure is above about $1 \times 10^{19}$ cm$^{-3}$.

8. A method of forming an LED according to claim 1 wherein the step of forming the degenerate junction structure comprises forming a p-n junction structure from a degeneratively-doped p-type Group II-VI epilayer on the p-type semiconductor layer and a degeneratively-doped n-type Group II-VI epilayer on the p-type Group II-VI carbide epilayer.

9. A method of forming an LED according to claim 8 wherein the carrier concentration in each layer of the degeneratively doped p-n junction structure is above about $1 \times 10^{19}$ cm$^{-3}$.

10. A method of forming an LED according to claim 1 wherein step of forming the degenerate junction structure comprises forming a p-type semiconductor layer and an n-type semiconductor layer, both of which are thin enough to substantially avoid absorption of light emitted from the active region.

11. A method of forming an LED according to claim 10 wherein the step of forming the degenerate junction structure comprises forming layers of a p-type epilayer and an n-type epilayer that are each less than about 1000 Å thick.

12. A method of forming an LED according to claim 1, wherein the step of forming the active region comprises forming the n-type semiconductor layer on a substrate, wherein the substrate comprises a single crystal silicon carbide selected from the group consisting of the 3C, 4H, 6H, and 15R polytypes.

13. A method of forming an LED according to claim 1, wherein the step of forming the active region comprises forming the n-type semiconductor layer on a substrate, wherein the substrate comprises a Group III nitride layer.

14. A method of forming a light emitting device (LED) that incorporates a Group III nitride layer, the method comprising:
  forming a degenerate junction structure on an n-type semiconductor layer, wherein the degenerate junction structure comprises a degenerately doped n-type epilayer on the n-type semiconductor layer and a degenerately doped p-type epilayer on the n-type epilayer;
  forming a p-type semiconductor layer on the p-type epilayer of the degenerate junction structure;
  forming an n-type Group III nitride active region on the p-type semiconductor layer;
  forming an n-type semiconductor contact layer on the active region;
  wherein the degenerate junction structure couples the p-type semiconductor layer to the LED anode to thereby permit electric current flow from the anode to the active region.

15. A method of forming an LED according to claim 14 wherein the carrier concentration in each layer of the degenerate junction structure is above about $1 \times 10^{19}$ cm$^{-3}$.

16. A method of forming an LED according to claim 14, wherein the step of forming the p-type epilayer comprises forming a layer of silicon carbide doped with aluminum.

17. A method of forming an LED according to claim 14, wherein the step of forming the n-type epilayer comprises forming a layer of silicon carbide doped with a dopant selected from the group consisting of nitrogen and phosphorous.

18. A method of forming an LED according to claim 14, wherein the step of forming the degenerate junction structure comprises forming a p-n junction structure from a degeneratively-doped n-type Group III nitride epilayer on the n-type semiconductor layer and a degeneratively-doped p-type Group III nitride epilayer on the n-type silicon carbide epilayer.

19. A method of forming an LED according to claim 14, wherein the step of forming the degenerate junction structure comprises forming a p-n junction structure from a degeneratively-doped n-type Group II-VI epilayer on the n-type semiconductor layer and a degeneratively-doped p-type Group II-VI epilayer on the n-type Group II-VI epilayer.

20. A method of forming an LED according to claim 14 wherein step of forming the degenerate junction structure comprises forming the p-type epilayer and the n-type epilayer to a combined thickness that substantially avoids absorption of light emitted from the active region.

21. A method of forming an LED according to claim 14 wherein the step of forming the degenerate junction structure comprises forming layers of a p-type epilayer and an n-type epilayer that are each less than about 1000 Å thick.

22. A method of forming an LED according to claim 14, wherein the step of forming the degenerate junction structure comprises forming the degenerate junction structure on a substrate comprising a single crystal silicon carbide selected from the group consisting of the 3C, 4H, 6H, and 15R polytypes.

23. A method of forming an LED according to claim 14, wherein the step of forming the degenerate junction structure comprises forming the degenerate junction structure on a substrate comprising a Group III nitride layer.

24. A method of forming a light emitting device (LED) that conducts a forward biased electrical current from the anode contact to the cathode contact, comprising:
  forming a Group III nitride active region for light emission from the LED;
  forming a minority carrier source layer adjacent the active region for injecting minority carriers into the active region;
  forming a tunnel diode structure adjacent the minority carrier source layer, the tunnel diode structure having a degenerately doped n-type semiconductor epilayer and a degenerately doped p-type semiconductor epilayer that permit quantum mechanical tunneling of carriers between the epilayers of the tunnel diode; and
  positioning the tunnel diode structure between layers of the LED having opposite conductivity type to thereby permit electric current flow from the minority carrier source layer to the cathode of the device.

25. A method of forming an LED according to claim 24, wherein the step of positioning the tunnel diode comprises forming the p-type epilayer of the tunnel diode on the minority carrier source layer.

26. A method of forming an LED according to claim 25 wherein the carrier concentration in each layer of the tunnel diode is above about $1 \times 10^{19}$ cm$^{-3}$.

27. A method of forming an LED according to claim 26, wherein the step of forming the tunnel diode comprises forming a degenerate p-type epilayer of silicon carbide doped with aluminum.

28. A method of forming an LED according to claim 26, wherein the step of forming the tunnel diode comprises forming a degenerate n-type epilayer of silicon carbide doped with a dopant selected from the group consisting of nitrogen and phosphorous.

29. A method of forming an LED according to claim 26, wherein the step of forming the tunnel diode comprises forming a p-n junction structure of doped Group III nitride epilayers.

30. A method of forming an LED according to claim 26, wherein the step of forming the tunnel diode comprises forming a p-n junction structure of doped Group II-VI epilayers.

31. A method of forming an LED according to claim 26 wherein step of forming the tunnel diode comprises forming the p-type epilayer and the n-type epilayer to a total thickness that substantially avoids absorption of light emitted from the active region.

32. A method of forming an LED according to claim 26 wherein the step of forming the tunnel diode comprises forming layers of a p-type epilayer and an n-type epilayer that are each less than about 1000 Å thick.

33. A method of forming an LED according to claim 26, wherein the step of forming the tunnel diode comprises forming the tunnel diode on a substrate comprising a single crystal silicon carbide selected from the group consisting of the 3C, 4H, 6H, and 15R polytypes.

34. A method of forming an LED according to claim 26, wherein the step of forming the tunnel diode comprises forming the tunnel diode on a substrate comprising a Group III nitride layer.

\* \* \* \* \*